(12) United States Patent
Cretella et al.

(10) Patent No.: US 12,283,803 B2
(45) Date of Patent: Apr. 22, 2025

(54) WEATHERPROOF POP-UP ELECTRICAL DEVICE ENCLOSURES

(71) Applicant: Hubbell Incorporated, Shelton, CT (US)

(72) Inventors: Joseph Nicholas Cretella, Ansonia, CT (US); Felix Omar Perez, Hagerstown, MD (US)

(73) Assignee: Hubbell Incorporated, Shelton, CT (US)

( * ) Notice: Subject to any disclaimer, the term of this patent is extended or adjusted under 35 U.S.C. 154(b) by 137 days.

(21) Appl. No.: 17/823,005

(22) Filed: Aug. 29, 2022

(65) Prior Publication Data

US 2023/0060592 A1 Mar. 2, 2023

Related U.S. Application Data

(60) Provisional application No. 63/238,292, filed on Aug. 30, 2021.

(51) Int. Cl.
*H02G 3/08* (2006.01)
*H05K 5/02* (2006.01)
*H05K 5/06* (2006.01)

(52) U.S. Cl.
CPC .......... *H02G 3/088* (2013.01); *H05K 5/0217* (2013.01); *H05K 5/061* (2013.01)

(58) Field of Classification Search
None
See application file for complete search history.

(56) References Cited

U.S. PATENT DOCUMENTS

| | | | |
|---|---|---|---|
| 7,605,330 B1 | 10/2009 | Black et al. | |
| 7,626,120 B1 | 12/2009 | Golden et al. | |
| 11,038,331 B1 | 6/2021 | Baldwin | |
| 2015/0372467 A1* | 12/2015 | Wade | H02G 3/088 |
| | | | 174/481 |
| 2017/0288282 A1 | 10/2017 | Thramann et al. | |
| 2020/0185897 A1 | 11/2020 | Bonilla et al. | |
| 2021/0053456 A1 | 2/2021 | Freeling-Wilkinson | |
| 2021/0252989 A1* | 8/2021 | Price | B60L 53/31 |
| 2023/0140080 A1* | 5/2023 | Galazin | H01R 25/003 |
| | | | 174/53 |

OTHER PUBLICATIONS

Lew Outdoor Outdoor Kitchen Countertop Box, 2019.
Legrand Outdoor Ground Box, Feb. 2019.

* cited by examiner

*Primary Examiner* — Krystal Robinson
(74) *Attorney, Agent, or Firm* — Ruggiero McAllister & McMahon LLC

(57) ABSTRACT

An electrical device enclosure is provided that includes an electrical device; a telescoping support member having the electrical device supported thereon; an electrical device region, the telescoping support member being configured to move the electrical device into a stored position in a first space defined in the electrical device region and to move the electrical device into a deployed position outside of the first space; and a hood pivotally connected to the electrical device for movement between a hooded position and an unhooded position. The hood and electrical device region have cooperating surfaces, the cooperating surfaces being configured and positioned so that movement of the electrical device to the stored position moves the hood into sealed contact with the electrical device to define a weather-tight space around the electrical device.

21 Claims, 4 Drawing Sheets

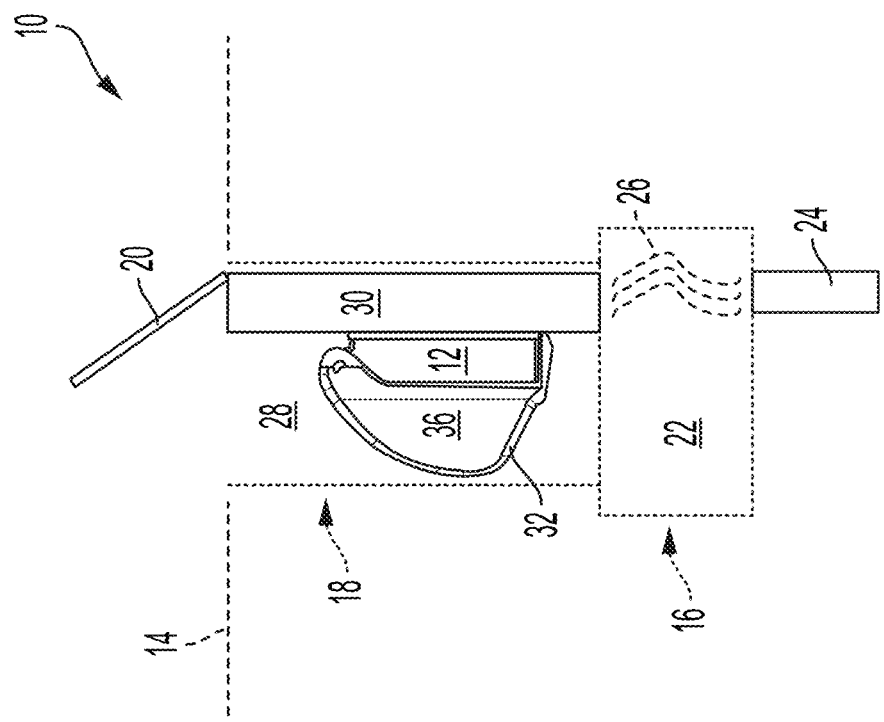
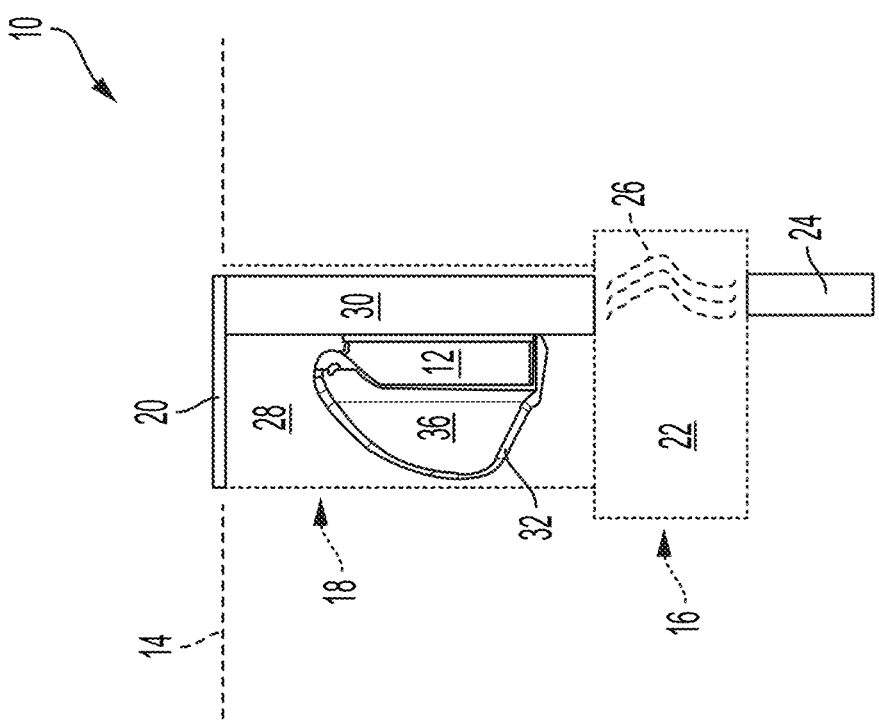

WEATHERPROOF POP-UP ELECTRICAL DEVICE ENCLOSURES

CROSS REFERENCE TO RELATED APPLICATIONS

This application claims the benefit of U.S. Application 63/238,292 filed Aug. 30, 2021, the contents of which are incorporated by reference herein.

BACKGROUND

1. Field of the Invention

The present disclosure is related to electrical device enclosures. More particularly, the present disclosure is related to weatherproof pop-up electrical device enclosures.

2. Description of Related Art

The deployment of electrical devices in regions exposed to water and other high moisture environments are becoming commonplace in residential and/or commercial settings. When deploying power outlets or other electrical devices in outdoor locations, enclosures are often required to provide attributes such as, but not limited to, protecting the electrical device from weather, improving the visual appearance of the electrical device, and others.

Many outdoor enclosures avoid/mitigate the challenges with respect to egress of water, moisture, snow, and insects, by being mounted on a surface above ground. While these above ground enclosures overcome many of the issues with below ground mountings, these solutions can be unsightly to the consumer/user.

Some outdoor enclosures are mounted at or below the ground level—which can provide a pleasing, low-profile visual appearance. However, these below ground level enclosures can present challenges due to the egress of water, moisture, snow, insects, rodents, and the like. These issues can often require the below ground enclosures to include expensive and/or difficult to use sealing mechanisms/devices. Further, these issues can often require the below ground enclosures to be installed using costly and/or time-consuming drainage solutions, particularly when seeking listing by Underwriters Laboratories (UL listing) for the enclosure.

Accordingly, there is a need for electrical device enclosures that overcome, alleviate, and/or mitigate one or more of the aforementioned and other deleterious effects of prior art enclosures.

SUMMARY

An electrical device enclosure is provided that includes an electrical device; a telescoping support member having the electrical device supported thereon; an electrical device region, the telescoping support member being configured to move the electrical device into a stored position in a first space defined in the electrical device region and to move the electrical device into a deployed position outside of the first space; and a hood pivotally connected to the electrical device for movement between a hooded position and an unhooded position. The hood and electrical device region have cooperating surfaces, the cooperating surfaces being configured and positioned so that movement of the electrical device to the stored position moves the hood into sealed contact with the electrical device to define a weather-tight space around the electrical device.

In some embodiments either alone or together with any one or more of the aforementioned and/or after-mentioned embodiments, the electrical device is selected from a group consisting of a junction box, a power outlet, a switch, a compressed air outlet, a vacuum outlet, a fluid outlet, an internet or communication signal outlets, a light, a camera, an audio speakers, and any combinations thereof.

In some embodiments either alone or together with any one or more of the aforementioned and/or after-mentioned embodiments, the electrical device is a ground fault circuit interrupter (GFCI) outlet or a non-GFCI outlet which is protected by a GFCI outlet or GFCI circuit breaker.

In some embodiments either alone or together with any one or more of the aforementioned and/or after-mentioned embodiments, the electrical device enclosure further includes a gasket or seal between the hood and the electrical device.

In some embodiments either alone or together with any one or more of the aforementioned and/or after-mentioned embodiments, the hood is configured so that all connections to the electrical device in the weather-tight space around the electrical device must be removed in order for the hood to move with respect to the electrical device to the hooded position.

In some embodiments either alone or together with any one or more of the aforementioned and/or after-mentioned embodiments, one or more of the electrical device, the hood, and the electrical device region are configured to prevent storage of the electrical device in the first space unless all connections to the electrical device in the weather-tight space around the electrical device have been removed.

In some embodiments either alone or together with any one or more of the aforementioned and/or after-mentioned embodiments, the cooperating surface of the hood is a curved surface and the cooperating surface of the electrical device region is a linear surface.

In some embodiments either alone or together with any one or more of the aforementioned and/or after-mentioned embodiments, the electrical device region has an upper edge that, when in the stored position, is at or least partially below ground level.

In some embodiments either alone or together with any one or more of the aforementioned and/or after-mentioned embodiments, the electrical device enclosure further includes a cover on the upper edge.

In some embodiments either alone or together with any one or more of the aforementioned and/or after-mentioned embodiments, the cover is stationary or pivoting with respect to the upper edge.

In some embodiments either alone or together with any one or more of the aforementioned and/or after-mentioned embodiments, the cover further includes at least one opening.

In some embodiments either alone or together with any one or more of the aforementioned and/or after-mentioned embodiments, the electrical device enclosure further includes a load conduit running into the electrical device region through the telescoping support member, and into the electrical device in a weather-tight manner.

In some embodiments either alone or together with any one or more of the aforementioned and/or after-mentioned embodiments, the electrical device enclosure further includes a junction box region depending from the electrical device region, the junction box region defining a weather-tight junction space for connecting a line conduit to the load conduit.

In some embodiments either alone or together with any one or more of the aforementioned and/or after-mentioned embodiments, the load conduit runs into the electrical device region through the telescoping support member and into the electrical device in a weather-tight manner when the telescoping support member moves between the stored and deployed positions.

In some embodiments either alone or together with any one or more of the aforementioned and/or after-mentioned embodiments, the telescoping support member is normally biased to the deployed position.

In some embodiments either alone or together with any one or more of the aforementioned and/or after-mentioned embodiments, the telescoping support member further includes a biasing member biasing the telescoping support member to the deployed position.

In some embodiments either alone or together with any one or more of the aforementioned and/or after-mentioned embodiments, the biasing member is selected from a group consisting of a spring, a gas prop strut, a linear actuator, any combinations thereof.

In some embodiments either alone or together with any one or more of the aforementioned and/or after-mentioned embodiments, the electrical device enclosure further includes a catch configured to selectively overcome the force of the biasing member to hold or secure the telescoping support member in the stored position.

In some embodiments either alone or together with any one or more of the aforementioned and/or after-mentioned embodiments, one or more of the electrical device, the telescoping support member, and the electrical device region are configured so that movement from the deployed position to the stored position displaces fluid in the first space.

In some embodiments either alone or together with any one or more of the aforementioned and/or after-mentioned embodiments, the electrical device enclosure further includes a cover on the upper edge that includes at least one opening for fluid that is displaced.

The above-described and other features and advantages of the present disclosure will be appreciated and understood by those skilled in the art from the following detailed description, drawings, and appended claims.

BRIEF DESCRIPTION OF DRAWINGS

FIG. 1 is a schematic view of an exemplary embodiment of an electrical device enclosure according to the present disclosure in a closed, stored position;

FIG. 2 is a schematic view of the enclosure of FIG. 1 in an open, stored position;

DETAILED DESCRIPTION

Figure 3:
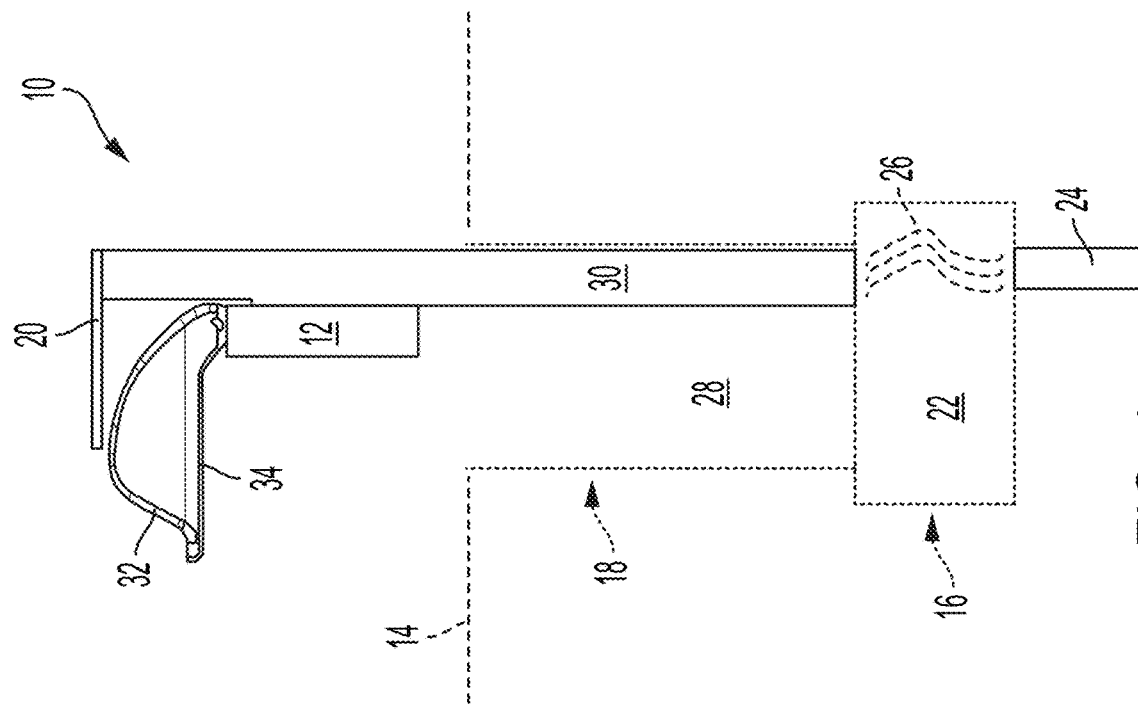
FIG. 3 is a schematic view of the enclosure of FIG. 1 in a deployed, hooded position.

Referring to the drawings and in particular with simultaneous reference to FIGS. 1-5, an exemplary embodiment of an electrical device enclosure according to the present disclosure is shown and is generally referred to by reference numeral 10. Enclosure 10 finds use with different types of electrical devices 12. In the illustrated embodiment, device 12 is shown as a power outlet such as a ground fault circuit interrupter (GFCI) outlet.

However, it is contemplated by the present disclosure for enclosure 10 to find use with any desired electrical device that requires a user to have temporary access to the device and can include electrical devices such as, but not limited to, a non-GFCI outlet that is protected by a GFCI outlet, a non-GFCI outlet that is protected by GFCI circuit breaker, a junction box, a power outlet, a switch, a compressed air outlet, a vacuum outlet, a fluid outlet, an internet or communication signal outlet, lighting, cameras, audio speakers, and others.

Figure 4:
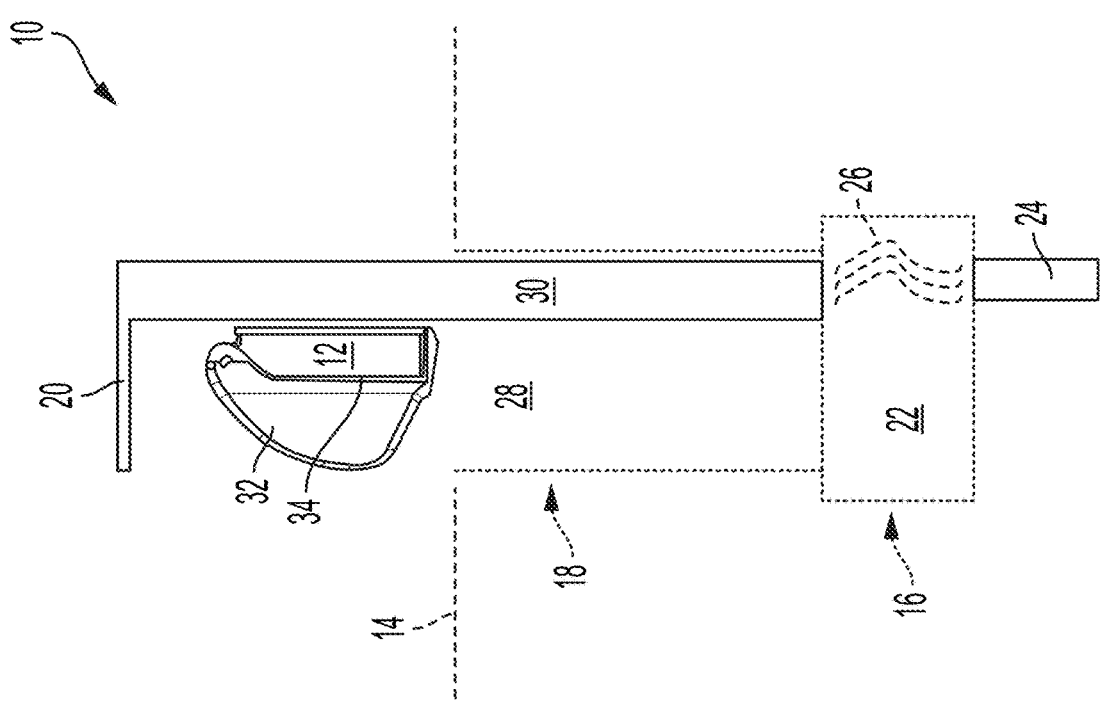
FIG. 4 is a schematic view of the enclosure of FIG. 1 in a deployed, unhooded position.

Advantageously, enclosure 10 is configured for movement of electrical device 12 between a stored position (FIG. 1) and a deployed position (FIGS. 3-4). Enclosure 10 is, when in the stored position, mounted below a surface level 14. However, enclosure 10, when in the deployed position, extends above surface level 14 for access of electrical device 12 by a user.

It should be recognized that as used herein, the term surface level 14 is used to mean any desired surface. In outdoor uses of enclosure 10, the surface level 14 can be formed by the earth (i.e., dirt/soil), pavers, natural stone, concrete, asphalt, gravel, grass, mulch, and others. In indoor uses of enclosure 10, the surface level 14 can be a counter, wall, floor, and others.

Enclosure 10 includes a junction box region 16, a device region 18, and a cover 20. In some embodiments, cover 20 can be integral with and/or non-movably secured to device region 18 as shown in FIG. 1 in a closed position.

In other embodiments, cover 20 can be movable with respect to device region 18 between a closed position (FIG. 1) and an open position (FIG. 2). Device 10 is configured for installation below surface level 14, namely so that an upper end of region 18 is at or below the surface level and/or so that cover 20 is about flush or even with the surface level.

Advantageously, enclosure 10 is configured to maintain device 12 in a weather-tight space in a simple and easy to use and install manner.

Region 16 is a weather-tight junction box defining a sealed junction space 22 for connecting a line conduit 24 to a load conduit 26.

Region 18 includes a storage space 28 in which electrical device 12 is mounted on telescoping support 30. Support 30 is configured to move device 12 between a stored position (FIGS. 1-2) in which the device is in space 28 (i.e., below level 14) and a deployed position (FIGS. 3-4) in which the device is extended from space 28 (i.e., above level 14).

In some embodiments, support 30 can have a biasing member (not shown) that normally biases the support to the deployed position. For example, support 30 can have one or more biasing members in the form of springs, gas prop struts, linear actuators, any combinations thereof, and others. Here, support 30 can have a catch (not shown) that selectively overcomes the force of biasing member to hold or secure support in the stored position and/or the deployed position. In some embodiments, cover 20 functions as the catch. In other embodiments, the catch can form a part of support 30 and/or region 18 and/or region 16.

Load conduit 26 runs from region 16, into region 18 through support 30, and into device 12 in a weather-tight manner. Further, load conduit 26 maintains the weather-tight connection when support 30 moves between the stored and deployed positions.

Enclosure 10 further includes a hood 32 pivotably mounted on device 12. Hood 32 pivots about an axis that is substantially parallel to a plan through ground level 14 between a hooded position (FIG. 3) and an unhooded position (FIG. 4).

Figure 5:
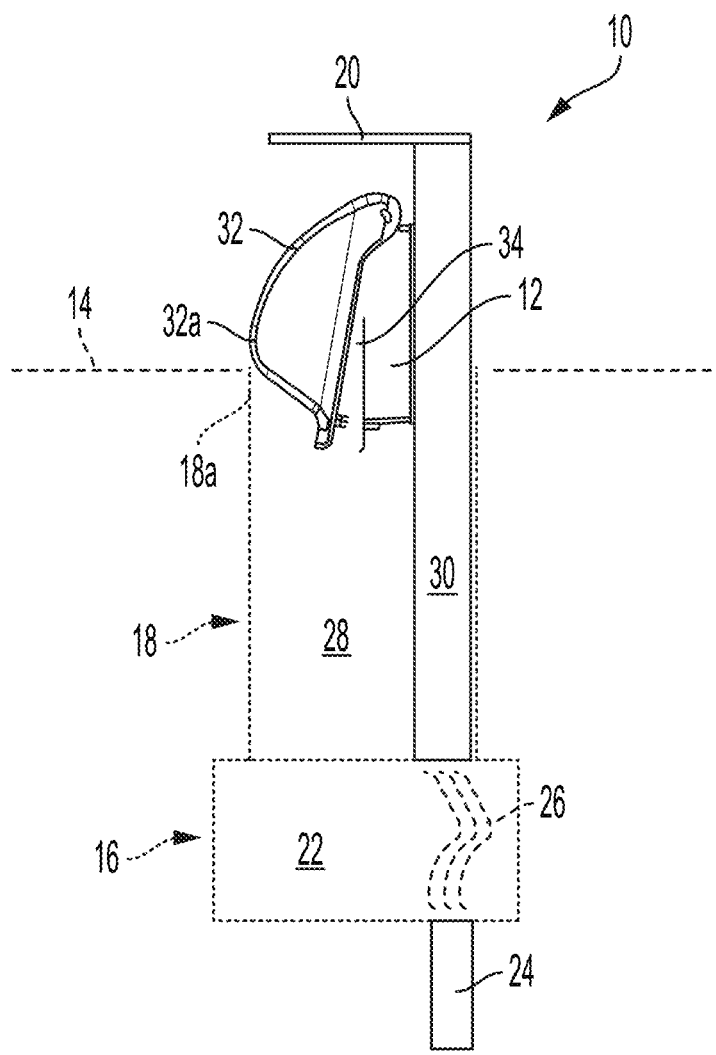
FIG. 5 is a schematic view of the enclosure of FIG. 1 during movement from the deployed position to the stored position.

As shown in FIG. 5, enclosure 10 includes interacting surfaces 18a, 32a on region 18 and hood 32, respectively. Surfaces 18a, 32a, that act as a cam and follower to urge, during the movement of support 30 from the deployed position to the storage position, the hood 32 from the unhooded position against device 12 in the hooded position in a manner sufficient to form a seal between the device 12 and the hood 32.

In the illustrated embodiment, hood 32 includes surface 32a in the form of a curved surface that slides over the linear inner surface 18a of region 18. The interaction of the curve of surface 32a and the linear surface 18a moves hood 32 inward against device 12. Of course, other configurations of surfaces 18a and/or 32a sufficient to move hood 32 against device 12 are contemplated by the present disclosure.

Enclosure 10 can include a seal or gasket 34 between device 12 and hood 32. Gasket 34 can be positioned on device 12, on hood 32, or on both the device and the hood. In this embodiment, the interaction of surfaces 18a, 32a is further sufficient to add a compressive or sealing force on gasket 34.

In some embodiments, enclosure 10 can be configured, via the interaction of surfaces 18a, 32, to form another weather-tight space 36 within the area defined by hood 32 and device 12.

Thus, enclosure 10 can function as a pop-up device that can selectively deploy and store device 12 in region 18 in a weather-tight manner.

Movement of enclosure 10 from the deployed position (FIGS. 3-4) to the stored position (FIG. 1) can in some embodiments advantageously displace fluid that has collected in space 28 within region 18.

In some embodiments, electrical device 12, electrical device region 18, and the telescoping support member 30 are sized and configured so that movement from the deployed position to the stored position displaces fluid in space 28. In addition, telescoping support member 30 can be configured as a reciprocating displacement pump such that movement from the deployed position to the stored position displaces fluid in space 28.

Figure 6:
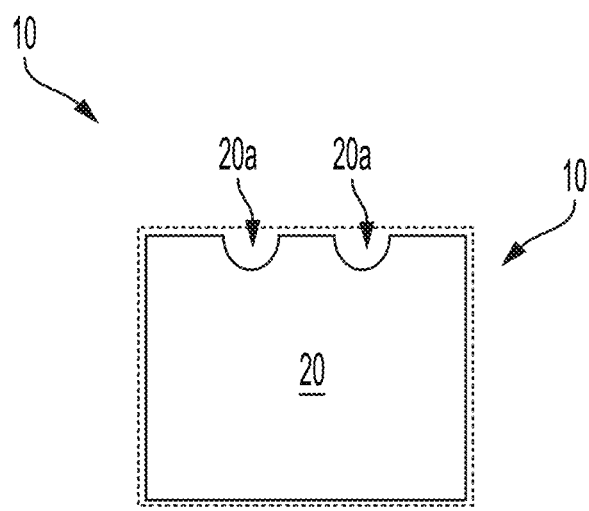
FIG. 6 is a top view of the enclosure of FIG. 1.

In some embodiments, the fluid that is displaced from space 28 during the storage of device 12 in region 18 is forced out of enclosure 10 through cover 20 and/or in the space between the cover and region 18. As shown in FIG. 6, cover 20 can include one or more openings 20a to allow water displaced out of enclosure 10 to exit space 28. Although shown in cover 20, it is contemplated by the present disclosure for openings 20a to be formed in the cover, electrical device region 18, telescoping support member 30, and combinations thereof.

It is contemplated by the present disclosure for gasket 34 to be configured so that a cord or wire (not show) can be plugged into device 12 within weather-tight space 36—namely can seal the cord or wire between. In this manner, air can be trapped in weather-tight space 36 to prevent water from entering and, in some embodiments, allow the cord or wire to be operatively connected to device 12 while in the retracted position with the cord or wire could exiting out of opening 20a.

When openings 20a are present in cover 20, the openings can provide one or more functions such as, but not limited to, allowing for the egress cables electrical device region 18, allowing for the user to reach into the region to pull up telescoping support member 30, if needed, allowing for egress of a tool (e.g., screw driver) for installation or service, and others.

In some embodiments, hood 32 can be configured so that all connections to device 12 in space 36 must be disconnected in order for the hood to move with respect to device 12 to the hooded position. Stated differently, enclosure 10 is configured to prevent storage of device 12 in space 28 within region 18 unless all connections to device 12 within space 36 have been removed.

Thus and when enclosure 10 is in the storage position, hood 32 maintains a seal with device 12 as a result of the interaction of surfaces 18a, 32a of region 18 and hood 32.

It should also be noted that the terms "first", "second", "third", "upper", "lower", and the like may be used herein to modify various elements. These modifiers do not imply a spatial, sequential, or hierarchical order to the modified elements unless specifically stated.

While the present disclosure has been described with reference to one or more exemplary embodiments, it will be understood by those skilled in the art that various changes may be made and equivalents may be substituted for elements thereof without departing from the scope of the present disclosure. In addition, many modifications may be made to adapt a particular situation or material to the teachings of the disclosure without departing from the scope thereof. Therefore, it is intended that the present disclosure not be limited to the particular embodiment(s) disclosed as the best mode contemplated, but that the disclosure will include all embodiments falling within the scope of the appended claims.

PARTS LIST enclosure 10
electrical device 12
surface level 14
junction box region 16
device region 18
cover 20
cover openings 20a
sealed junction space 22
line conduit 24
load conduit 26
storage space 28
telescoping support 30
hood 32
interacting surfaces 18a, 32a
seal or gasket 34
weather-tight space 36

What is claimed is:

1. An electrical device enclosure, comprising:
an electrical device;
a telescoping support member having the electrical device supported thereon;
an electrical device region, the telescoping support member being configured to move the electrical device into a stored position in a first space defined in the electrical device region and to move the electrical device into a deployed position outside of the first space; and
a hood pivotally connected to the electrical device for movement between a hooded position and an unhooded position,
wherein the hood and electrical device region have cooperating surfaces, the cooperating surfaces being configured and positioned so that movement of the electrical device to the stored position urges the hood into sealed contact with the electrical device to define a weather-tight space around the electrical device.

2. The electrical device enclosure of claim 1, wherein the electrical device is selected from a group consisting of a junction box, a power outlet, a switch, a compressed air outlet, a vacuum outlet, a fluid outlet, an internet or communication signal outlets, a light, a camera, an audio speakers, and any combinations thereof.

3. The electrical device enclosure of claim 1, wherein the electrical device is a ground fault circuit interrupter (GFCI) outlet or a non-GFCI outlet which is protected by a GFCI outlet or GFCI circuit breaker.

4. The electrical device enclosure of claim 1, further comprising a gasket or seal between the hood and the electrical device.

5. The electrical device enclosure of claim 1, wherein the hood is configured so that all connections to the electrical device in the weather-tight space around the electrical device must be removed in order for the hood to move with respect to the electrical device to the hooded position.

6. The electrical device enclosure of claim 1, wherein one or more of the electrical device, the hood, and the electrical device region are configured to prevent storage of the electrical device in the first space unless all connections to the electrical device in the weather-tight space around the electrical device have been removed.

7. The electrical device enclosure of claim 1, wherein the cooperating surface of the hood is a curved surface and the cooperating surface of the electrical device region is a linear surface.

8. The electrical device enclosure of claim 1, wherein the electrical device region has an upper edge that, when in the stored position, is at or least partially below ground level.

9. The electrical device enclosure of claim 1, further comprising a load conduit running into the electrical device region through the telescoping support member, and into the electrical device in a weather-tight manner.

10. The electrical device enclosure of claim 9, further comprising a junction box region depending from the electrical device region, the junction box region defining a weather-tight junction space for connecting a line conduit to the load conduit.

11. The electrical device enclosure of claim 10, wherein the load conduit runs into the electrical device region through the telescoping support member and into the electrical device in a weather-tight manner when the telescoping support member moves between the stored and deployed positions.

12. The electrical device enclosure of claim 1, wherein the telescoping support member is normally biased to the deployed position.

13. The electrical device enclosure of claim 1, wherein the telescoping support member further comprises a biasing member biasing the telescoping support member to the deployed position.

14. The electrical device enclosure of claim 13, wherein the biasing member is selected from a group consisting of a spring, a gas prop strut, a linear actuator, any combinations thereof.

15. The electrical device enclosure of claim 13, further comprising a catch configured to selectively overcome the force of the biasing member to hold or secure the telescoping support member in the stored position.

16. The electrical device enclosure of claim 1, wherein one or more of the electrical device, the telescoping support member, and the electrical device region are configured so that movement from the deployed position to the stored position displaces fluid in the first space.

17. The electrical device enclosure of claim 16, further comprising a cover on the upper edge that includes at least one opening for fluid that is displaced.

18. An electrical device enclosure, comprising:
an electrical device;
a hood pivotally connected to the electrical device;
a telescoping support member having the electrical device supported thereon;
an electrical device region, the telescoping support member being configured to move the electrical device and the hood into a stored position in a first space defined in the electrical device region and to move the electrical device into a deployed position outside of the first space, the electrical device region having an upper edge that, when in the stored position, is at or least partially below ground level; and
a cover on the upper edge covering the hood, the electrical device, and the first space,
wherein the hood and electrical device region have cooperating surfaces, the cooperating surfaces being configured and positioned so that movement of the electrical device to the stored position moves the hood into sealed contact with the electrical device to define a weather-tight space around the electrical device.

19. The electrical device enclosure of claim 18, wherein the cover is stationary or pivoting with respect to the upper edge.

20. The electrical device enclosure of claim 18, wherein the cover further comprises at least one opening.

21. An electrical device enclosure, comprising:
an electrical device;
a telescoping support member having the electrical device supported thereon;
an electrical device region, the telescoping support member being configured to move the electrical device into a stored position in a first space defined in the electrical device region and to move the electrical device into a deployed position outside of the first space; and
a hood pivotally connected to the electrical device, the hood having a curved outer cam surface,
wherein the cam surface is positioned and configured so that, during movement of the electrical device to the stored position, the cam surface interacts with a follower surface of the electrical device region to urge the hood into sealed contact with the electrical device to define a weather-tight space around the electrical device.

* * * * *